(12) United States Patent
Okuda

(10) Patent No.: US 11,427,923 B2
(45) Date of Patent: Aug. 30, 2022

(54) WORKPIECE HOLDING JIG AND LOADING AND UNLOADING APPARATUS

(71) Applicant: C.Uyemura & Co., Ltd., Osaka (JP)

(72) Inventor: Tomoji Okuda, Hirakata (JP)

(73) Assignee: C. Uyemura & Co., Ltd., Osaka (JP)

( * ) Notice: Subject to any disclaimer, the term of this patent is extended or adjusted under 35 U.S.C. 154(b) by 121 days.

(21) Appl. No.: 16/758,490

(22) PCT Filed: Sep. 18, 2018

(86) PCT No.: PCT/JP2018/034410
§ 371 (c)(1),
(2) Date: Apr. 23, 2020

(87) PCT Pub. No.: WO2019/082554
PCT Pub. Date: May 2, 2019

(65) Prior Publication Data
US 2020/0248331 A1    Aug. 6, 2020

(30) Foreign Application Priority Data
Oct. 27, 2017  (JP) .............................. JP2017-208515

(51) Int. Cl.
*C25D 17/06*    (2006.01)
(52) U.S. Cl.
CPC .................................. *C25D 17/06* (2013.01)
(58) Field of Classification Search
CPC ...... C25D 17/06; C25D 17/001; C25D 17/08; C23C 18/163
See application file for complete search history.

(56) References Cited

U.S. PATENT DOCUMENTS

2014/0020720 A1    1/2014  Fujikata et al.
2017/0321344 A1*  11/2017  Fendel .............. H01L 21/68764

FOREIGN PATENT DOCUMENTS

| JP | 2005-187910 A | 7/2005 |
| JP | 2009-287100 A | 12/2009 |
| JP | 2014-19900 A | 2/2014 |
| JP | 5576848 B2 | 8/2014 |
| JP | 2016-8344 A | 1/2016 |
| JP | 5898540 B2 | 4/2016 |
| KR | 10-2014-0137162 A | 12/2014 |
| WO | WO 2016/111028 A1 | 7/2016 |

OTHER PUBLICATIONS

International Search Report (PCT/ISA/210) issued in PCT Application No. PCT/JP2018/034410 dated Oct. 16, 2018 with English translation (two (2) pages).
Japanese-language Written Opinion (PCT/ISA/237) issued in PCT Application No. PCT/JP2018/034410 dated Oct. 16, 2018 (three (3) pages).
Supplementary European Search Report issued in European Application No. 18870492.8 dated Jun. 22, 2021 (five (5) pages).

* cited by examiner

*Primary Examiner* — Alexander W Keeling
*Assistant Examiner* — Mofoluwaso S Jebutu
(74) *Attorney, Agent, or Firm* — Crowell & Moring LLP

(57) ABSTRACT

It is configured that a frame body is locked to a back panel by: inserting a number of first pins of the frame body into a number of first holes of the back panel; moving a fastening body outward by a moving mechanism of a lock mechanism; and fitting a notch into a concave portion at the tip of the first pin.

17 Claims, 18 Drawing Sheets

WORKPIECE HOLDING JIG AND LOADING AND UNLOADING APPARATUS

TECHNICAL FIELD

The present invention relates to a workpiece holding jig for holding a plate-shaped workpiece, which is an object to be surface-treated, and to a loading and unloading apparatus that loads and unloads a plate-shaped workpiece into and from the workpiece holding jig. Examples of the workpiece include, for example, a printed circuit board, a wafer, and a semiconductor substrate (in particular, a Fan-Out Panel Level Package). Examples of the surface treatment include: (1) a plating treatment in which electroplating, electroless plating, displacement plating, or the like is performed; (2) a desmear treatment in which resin residues, etc., which have adhered during machining, etc., are removed from an object to be treated; (3) a pre-treatment before a predetermined treatment is performed; (4) a post-treatment after a predetermined treatment is performed; (5) a cleaning treatment as necessary before or after each treatment; (6) an activation treatment; (7) an etching treatment; and the like.

BACKGROUND ART

An example of the conventional workpiece holding jig for holding a plate-shaped workpiece includes, for example, the jig described in Patent Document 1. In this jig, a lower frame and an upper frame, for sandwiching a plate-shaped workpiece, are fixed by fastening screws.

PRIOR ART DOCUMENT

Patent Document

Patent Document 1; Japanese Patent Laid-open Publication No. 2005-187910

SUMMARY OF THE INVENTION

Problems to be Solved by the Invention

In the jig described in Patent Document 1, the work of fixing the upper frame to the lower frame is done by tightening a number of fastening screws one by one. Therefore, the fixing work is very troublesome and automation is also difficult.

A purpose of the present invention is to provide a workpiece holding jig by which fixing work can be done in one operation and a loading and unloading apparatus by which a plate-shaped workpiece can be automatically loaded and unloaded into and from the workpiece holding jig.

Solutions to the Problems

A first aspect of the present invention is a workpiece holding jig for holding a plate-shaped workpiece that is an object to be surface-treated, the workpiece holding jig including;
 a back panel that supports the workpiece from a side of a rear surface of the workpiece;
 a frame body that is attached to the back panel from a side of a front surface of the workpiece so as to hold a peripheral portion of the workpiece between the frame body and the back panel; and
 a lock mechanism for locking the frame body, attached to the back panel, to the back panel, wherein
 the lock mechanism includes:
 a number of first pins that are arranged along a periphery of the frame body and protrude from the frame body;
 a number of first holes that are formed in the back panel and through which the first pins can be inserted;
 two or more fastening bodies that are provided on a rear surface of the back panel and are movable in an inward and outward direction from a center along the rear surface of the back panel; and
 a moving mechanism that simultaneously moves all the fastening bodies in the inward and outward direction, wherein:
 the fastening body has, at its outer periphery, a fitting portion that can be fitted into a concave portion at a tip of the first pin exposed from the first hole; and
 the lock mechanism is configured to lock the frame body to the back panel by moving the fastening bodies outward with the moving mechanism and by fitting the fitting portion into the concave portion at the tip of the first pin.

A second aspect of the present invention is a loading and unloading apparatus for automatically loading and unloading a plate-shaped workpiece, which is an object to be surface-treated, into and from the workpiece holding jig for holding the workpiece according to the first aspect, the loading and unloading apparatus including:
 a housing unit that houses the workpiece holding jig that is locked;
 an attaching and detaching unit that attaches and detaches the back panel to and from the frame body in the workpiece holding jig housed in the housing unit; and
 a rotating unit that rotationally displaces the housing unit and the attaching and detaching unit between a vertical state and a horizontal state, wherein
 the attaching and detaching unit includes:
 a gripper that grips the back panel in the workpiece holding jig in the horizontal state from the side of the rear surface;
 a switching unit that turns on and off the lock mechanism by operating the moving mechanism; and
 an up-down moving unit that moves up and down the gripper gripping the back panel, and wherein
 the back panel is separated from the frame body by turning off the lock mechanism with the switching unit and by lowering the gripper with the up-down moving unit, whereby a space for loading and unloading the workpiece is created between the back panel and the frame body.

Effects of the Invention

According to the workpiece holding jig of the first aspect of the present invention, the frame body can be locked to the back panel only by operating the moving mechanism of the lock mechanism. Therefore, the work of fixing the frame body to the back panel can be done in one operation. Therefore, work efficiency can be improved.

According to the loading and unloading apparatus of the second aspect of the present invention, with respect to the work holding jig, it can be automatically done that the lock mechanism is turned off, the back panel is separated from the frame body, and the workpiece is placed on or taken out from the back panel. Therefore, the work of loading and unloading a workpiece can be done efficiently.

EMBODIMENTS OF THE INVENTION

[Workpiece Holding Jig]

Figure 1:
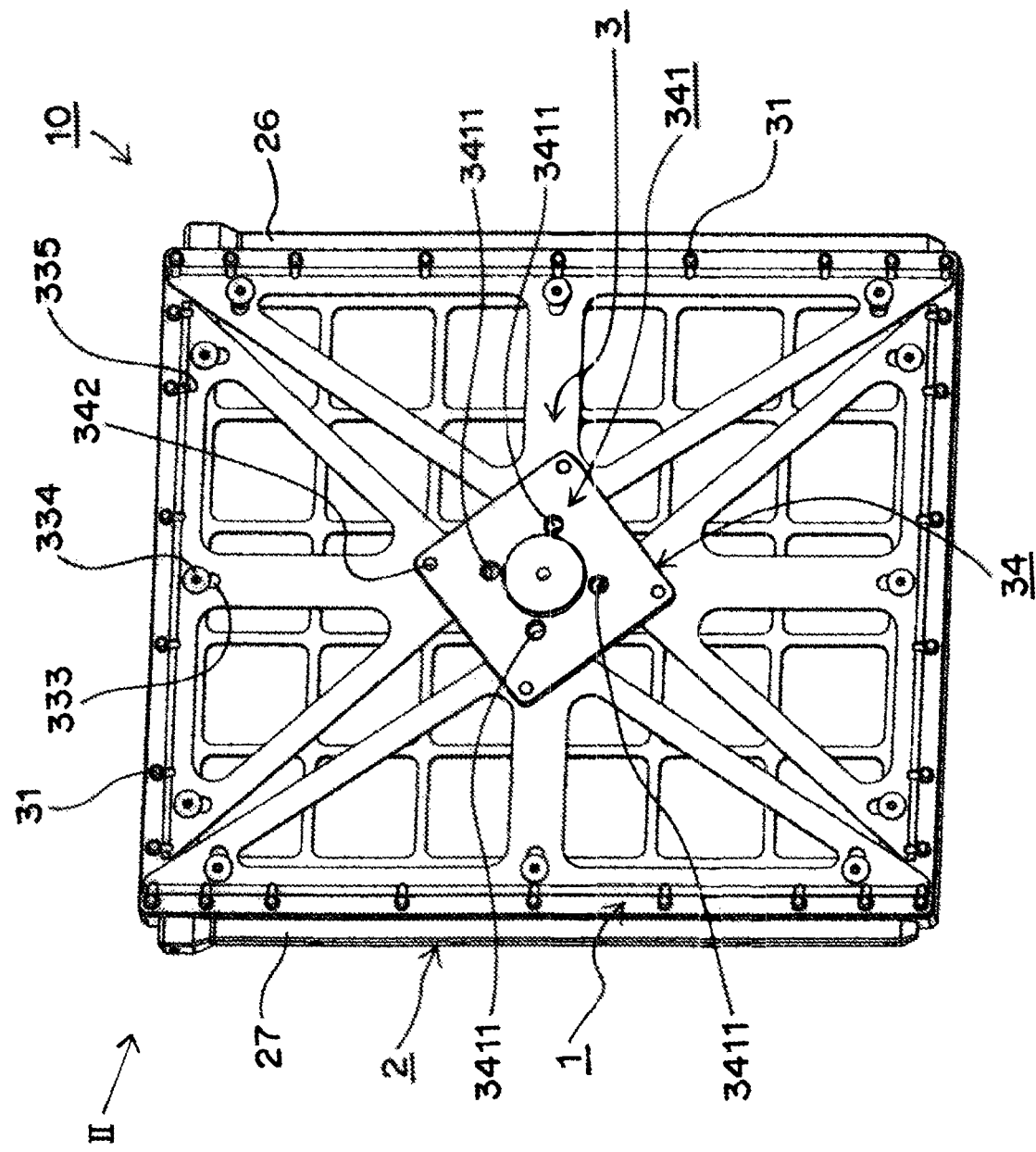
FIG. 1 is a rear perspective view of a workpiece holding jig according to one embodiment of the present invention, illustrating a lock mechanism in an off state.
Figure 2:
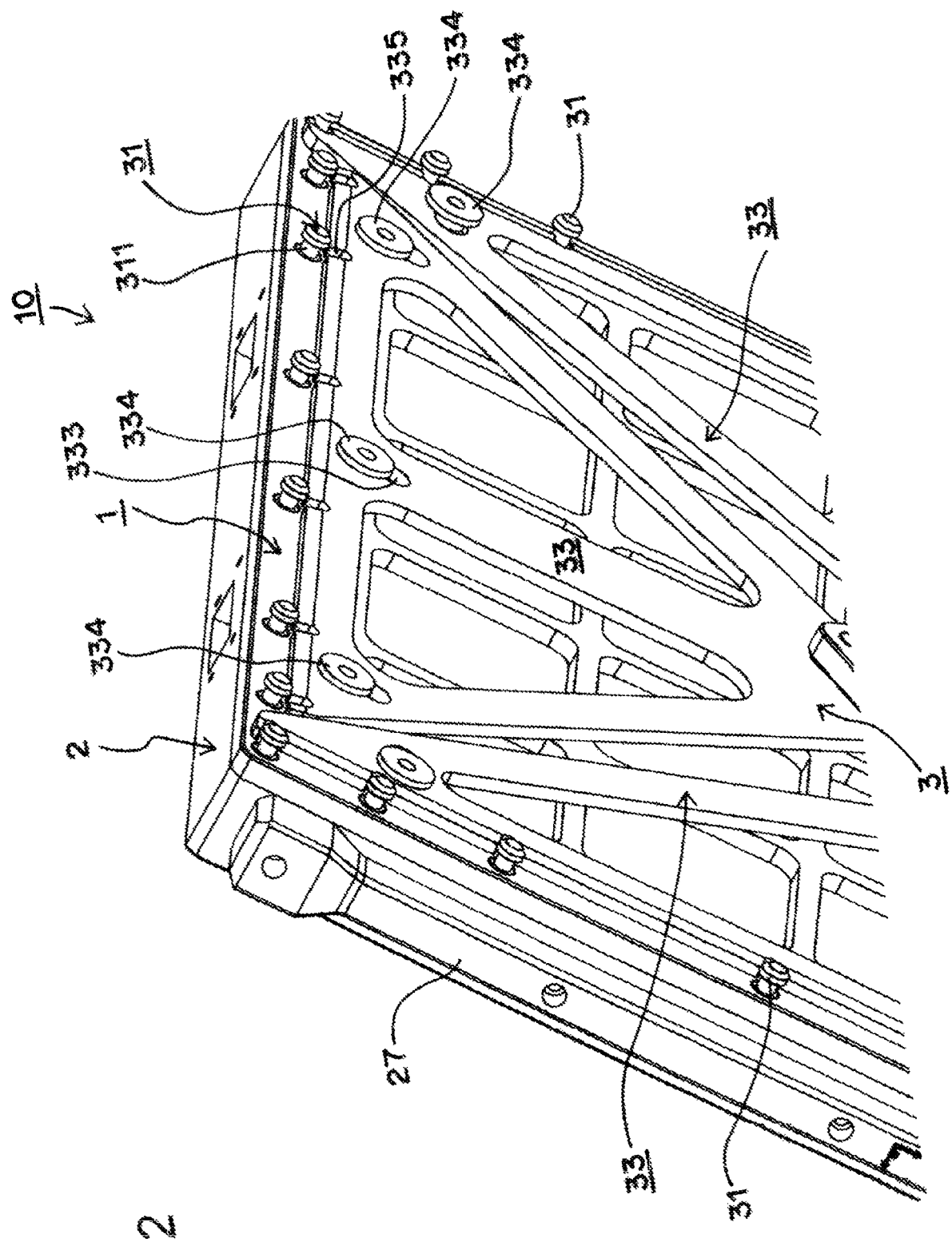
FIG. 2 is an enlarged partial view, viewed from arrow II in FIG. 1.

FIG. 1 is a rear perspective view of a workpiece holding jig according to one embodiment of the present invention. FIG. 2 is an enlarged partial view, viewed from arrow II in FIG. 1. A workpiece holding jig 10 includes a back panel 1, a frame body 2, and a lock mechanism 3.

Figure 3:
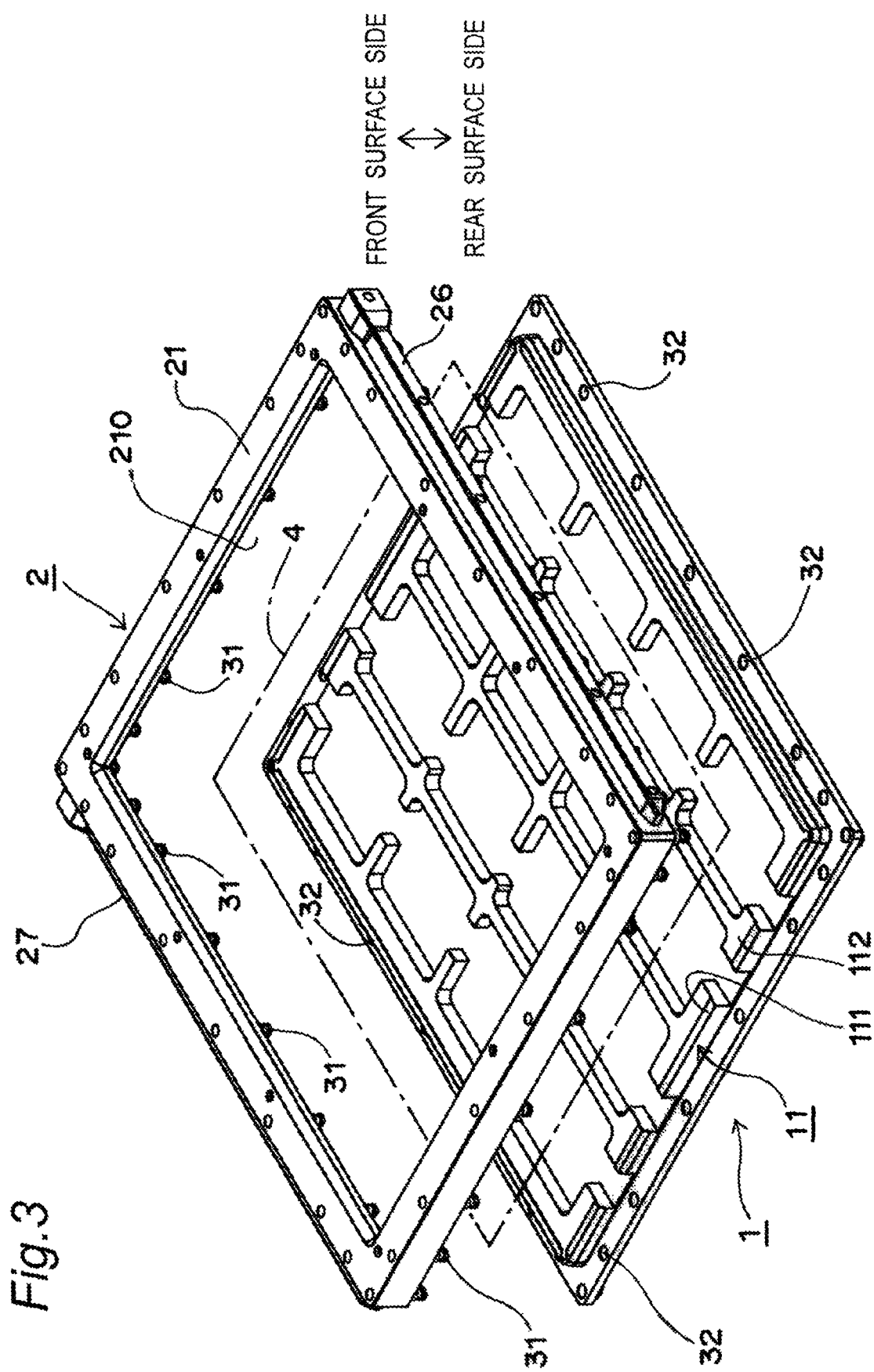
FIG. 3 is a perspective view illustrating a state in which a back panel is separated from a frame body.
Figure 4:
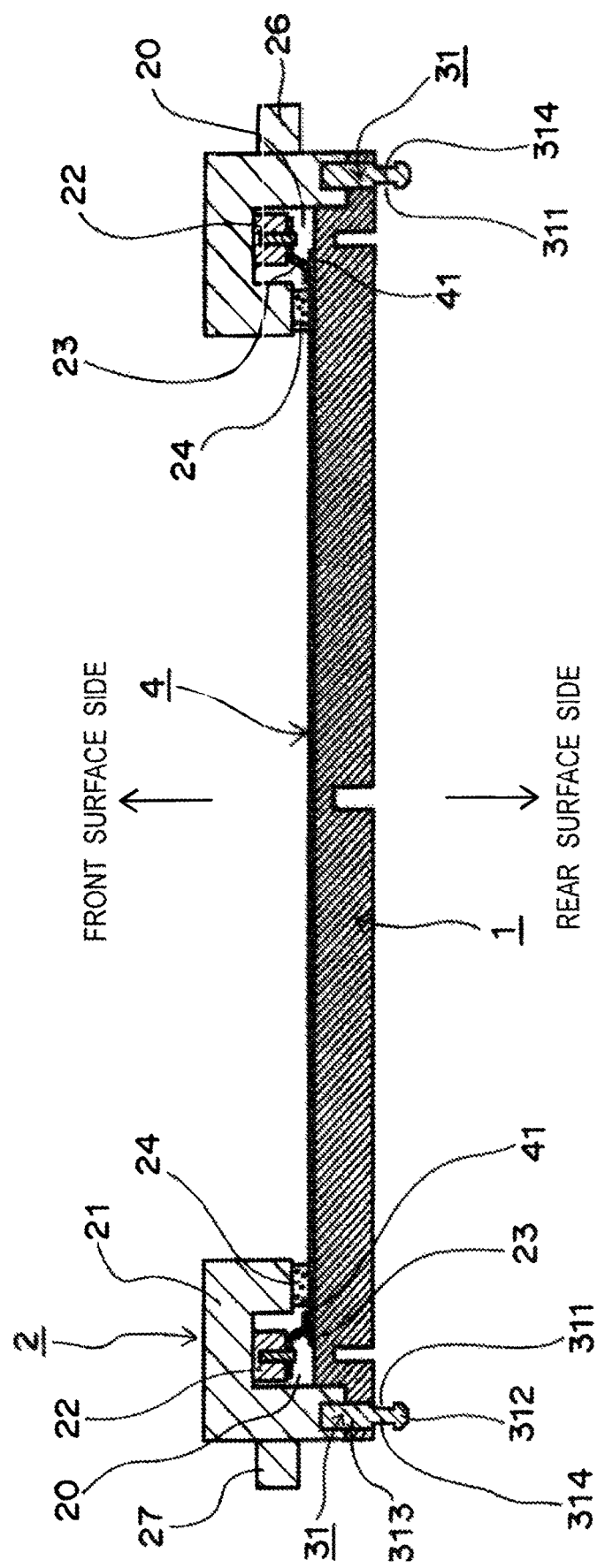
FIG. 4 is a cross-sectional view illustrating a state in which a workpiece is held by the back panel and the frame body.

As illustrated in FIG. 3, the back panel 1 has a rectangular shape in plan view and is configured to support a plate-shaped workpiece 4 having a rectangular shape in plan view from the side of its rear surface. The frame body 2 has a rectangular shape in plan view, and is configured to be capable of being attached to the back panel 1 from the side of the front surface of the workpiece 4 so as to hold the peripheral portion of the workpiece 4 between the frame body 2 and the back panel 1. FIG. 4 is a cross-sectional view illustrating a state in which the workpiece 4 is held by the back panel 1 and the frame body 2.

The frame body 2 has: a main body 21 having a rectangular annular shape; a conductive member 22 provided all around the main body 21; a contact member 23 that is electrically connected to the conductive member 22 and is provided along the conductive member 22 so as to be able to electrically contact a peripheral portion 41 of the workpiece 4; and a seal member 24 provided all around the main body 21 inside the contact member 23. The contact member 23 is provided along each side of the main body 21. A right guide bar 26 is provided outside the right side of the main body 21, and a left guide bar 27 is provided outside the left side of the main body 21.

The back panel 1 has a convex portion 11 that fits into an opening 210 of the main body 21 of the frame body 2, and the workpiece 4 is fitted into a shallow concave portion 112 formed in an upper surface 111 of the convex portion 11. Herein, the convex portion 11 has a substantially lattice structure, but it is preferable for it to have a planar structure.

Additionally, the frame body 2 is configured to form a sealed space 20 that houses the peripheral portion 41, the conductive member 22, and the contact member 23 in the state of FIG. 4, that is, in a state in which the seal member 24 and the contact member 23 are contacting the peripheral portion 41 of the workpiece 4. The seal member 24 is made of, for example, sponge rubber. The seal member 24 is compressed and closely adheres to the peripheral portion 41 of the workpiece 4.

The frame body 2 has a number of first pins 31. The first pins 31 are provided side by side along the periphery of the frame body 2, and protrude from the frame body 2 toward the rear surface. On the other hand, the back panel 1 has a number of first holes 32. The first hole 32 is formed such that the first pin 31 can be inserted therethrough. The frame body 2 is configured to be attached to the back panel 1 by inserting the first pins 31 through the first holes 32.

Figure 5:
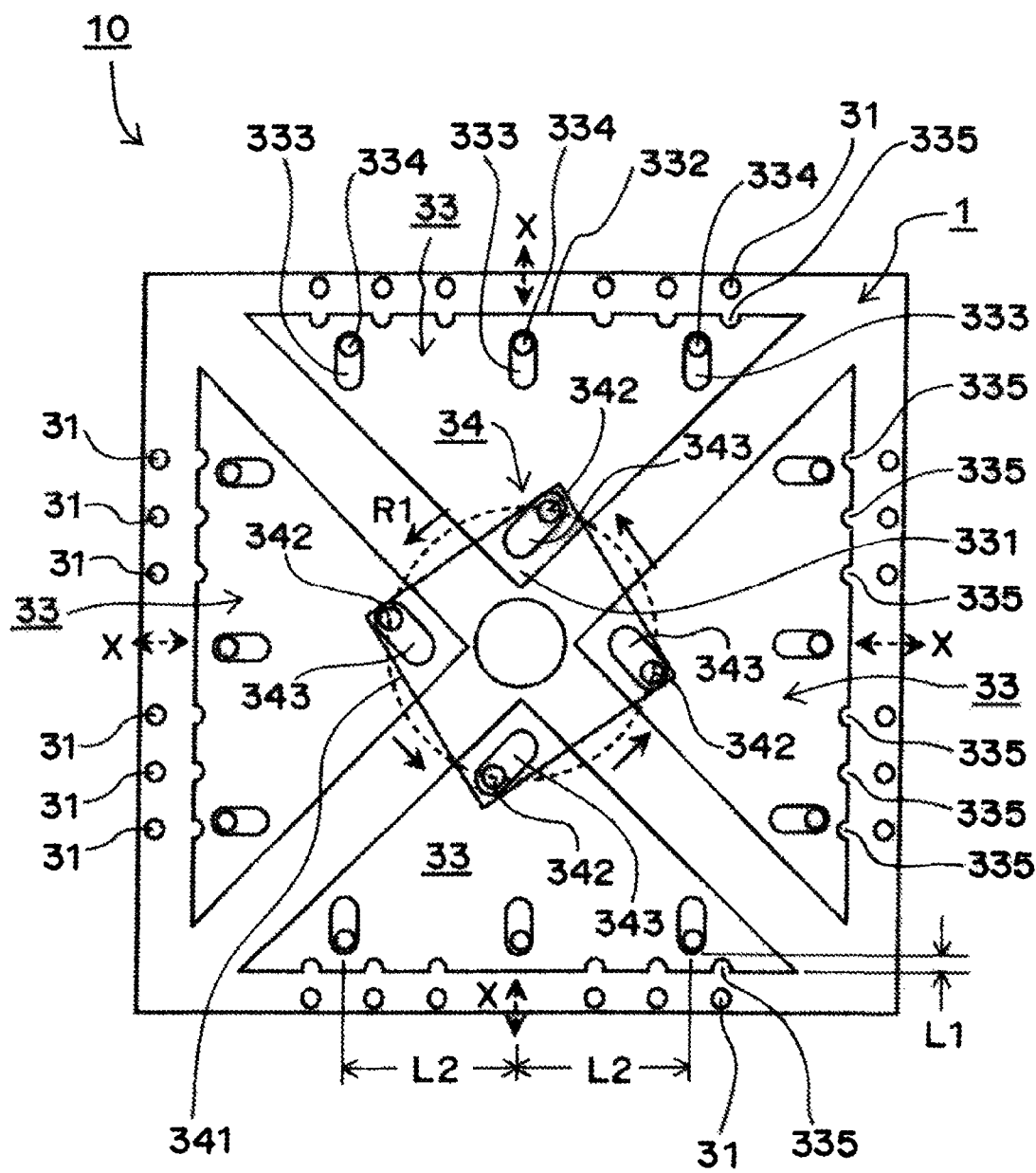
FIG. 5 is a schematic view illustrating an off state of the lock mechanism.
Figure 6:
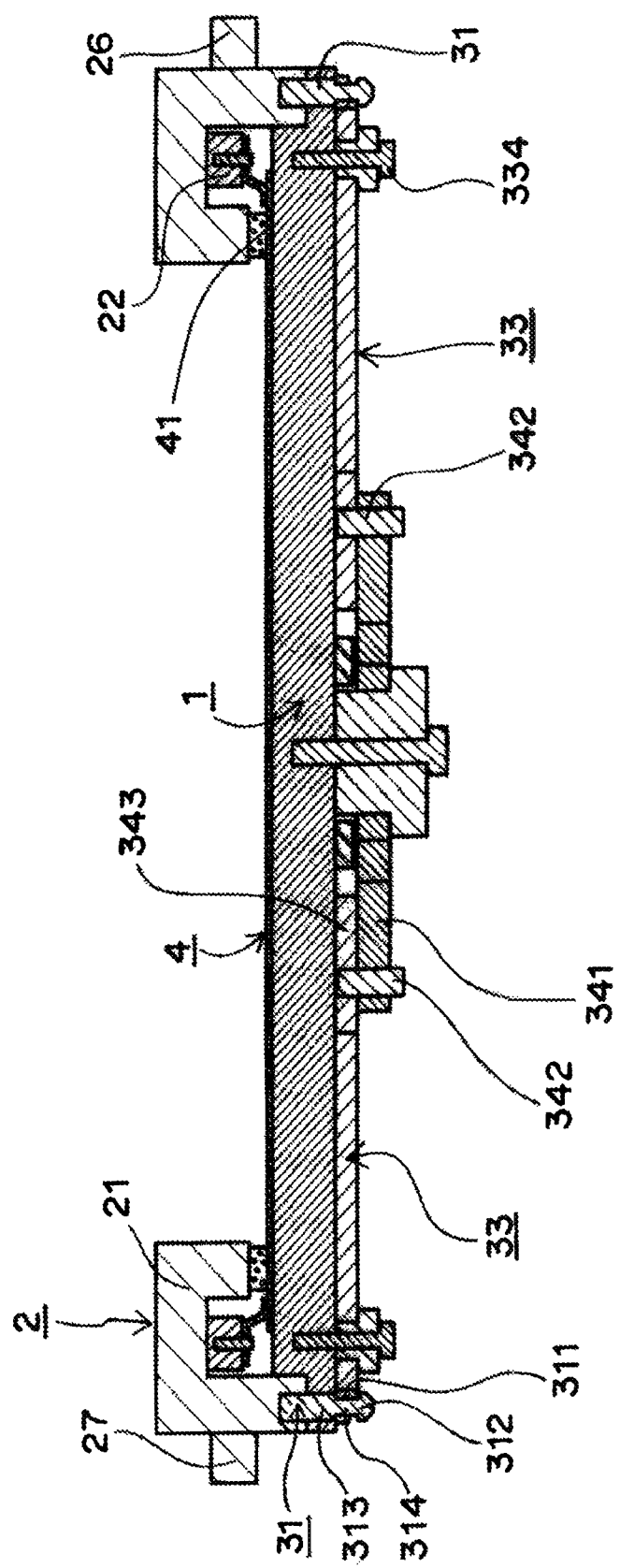
FIG. 6 is a cross-sectional view in which the lock mechanism is added to FIG. 4.

As illustrated in FIGS. 1 and 2, the lock mechanism 3 is provided on the side of the rear surface of the back panel 1. FIG. 5 is a schematic view of the lock mechanism 3. FIG. 6 is a cross-sectional view in which the lock mechanism 3 is added to FIG. 4. FIG. 6 illustrates a locked state. The lock mechanism 3 includes a number of the first pins 31 of the frame body 2, a number of the first holes 32 of the back panel 1, four fastening bodies 33, and a moving mechanism 34.

The fastening body 33 has a triangular shape in plan view. The fastening body 33 has here a frame structure as illustrated in FIGS. 1 and 2, but may have a plate structure. The fastening body 33 has a top 331 located near the center of the back panel 1 and a bottom side 332 located near the periphery of the back panel 1. The four fastening bodies 33 are arranged in the circumferential direction on the rear surface of the back panel 1. The fastening body 33 has three first long holes 333 each extending in a direction perpendicular to the bottom side 332. The three first long holes 333 are located at an equal distance L1 from the bottom side 332 and located at equal intervals L2 at the center and both ends of the bottom side 332. A second pin 334, protruding from the rear surface of the back panel 1, is inserted through each of the first long holes 333. Thereby, the fastening body 33 is configured to be able to move in an inward and outward direction (in the direction of arrow X) from the center along the rear surface of the back panel 1 by being slid along the second pin 334. Additionally, the fastening body 33 has a number of notches 335 at the bottom side 332. Each notch 335 is formed and arranged to fit into a concave portion 311 (FIGS. 4 and 6) at the tip of the first pin 31 of the frame body 2 when the fastening body 33 moves outward in the direction of arrow X. That is, the fastening body 33 has, at its outer periphery, a number of fitting portions for the first pins 31. The concave portion 311 is formed by a small-diameter portion 314 between a head portion 312 and a main body portion 313 of the first pin 31, and the notch 335 is configured to fit into the concave portion 311 by externally fitting to the small-diameter portion 314. In the fastening body 33, a number of the notches 335 are arranged at substantially equal intervals over the entire length of the bottom side 332.

Figure 7:
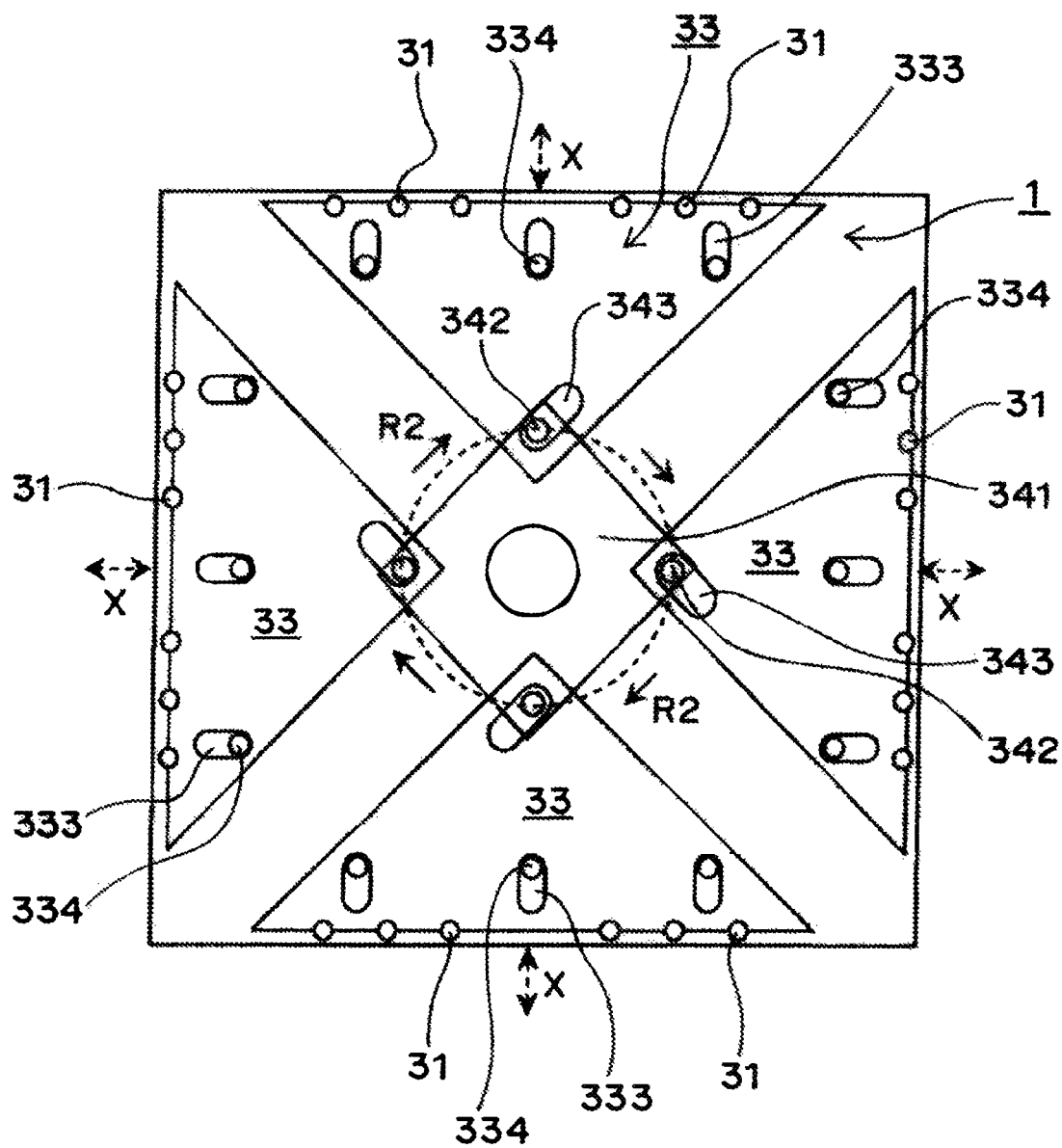
FIG. 7 is a schematic view illustrating an on state of the lock mechanism.

The moving mechanism 34 includes a rotating body 341 that rotates at the center of the rear surface of the back panel 1, four third pins 342 protruding from the rotating body 341 toward the rear surface of the back panel 1, and second long holes 343 formed in the tops 331 of the respective fastening bodies 33. The third pin 342 is inserted into the second long hole 343. The second long hole 343 extends obliquely with respect to the direction of arrow X. Thereby, the moving mechanism 34 is configured such that: the fastening body 33 is moved outward in the direction of arrow X by rotating the rotating body 341 in the direction of arrow R1 illustrated in FIG. 5 in order to slide the third pin 342 so as to move inward within the second long hole 343; and the fastening body 33 is moved inward in the direction of arrow X by rotating the rotating body 341 in the direction of arrow R2 illustrated in FIG. 7 in order to slide the third pin 342 so as to move outward within the second long hole 343.

Figure 8:
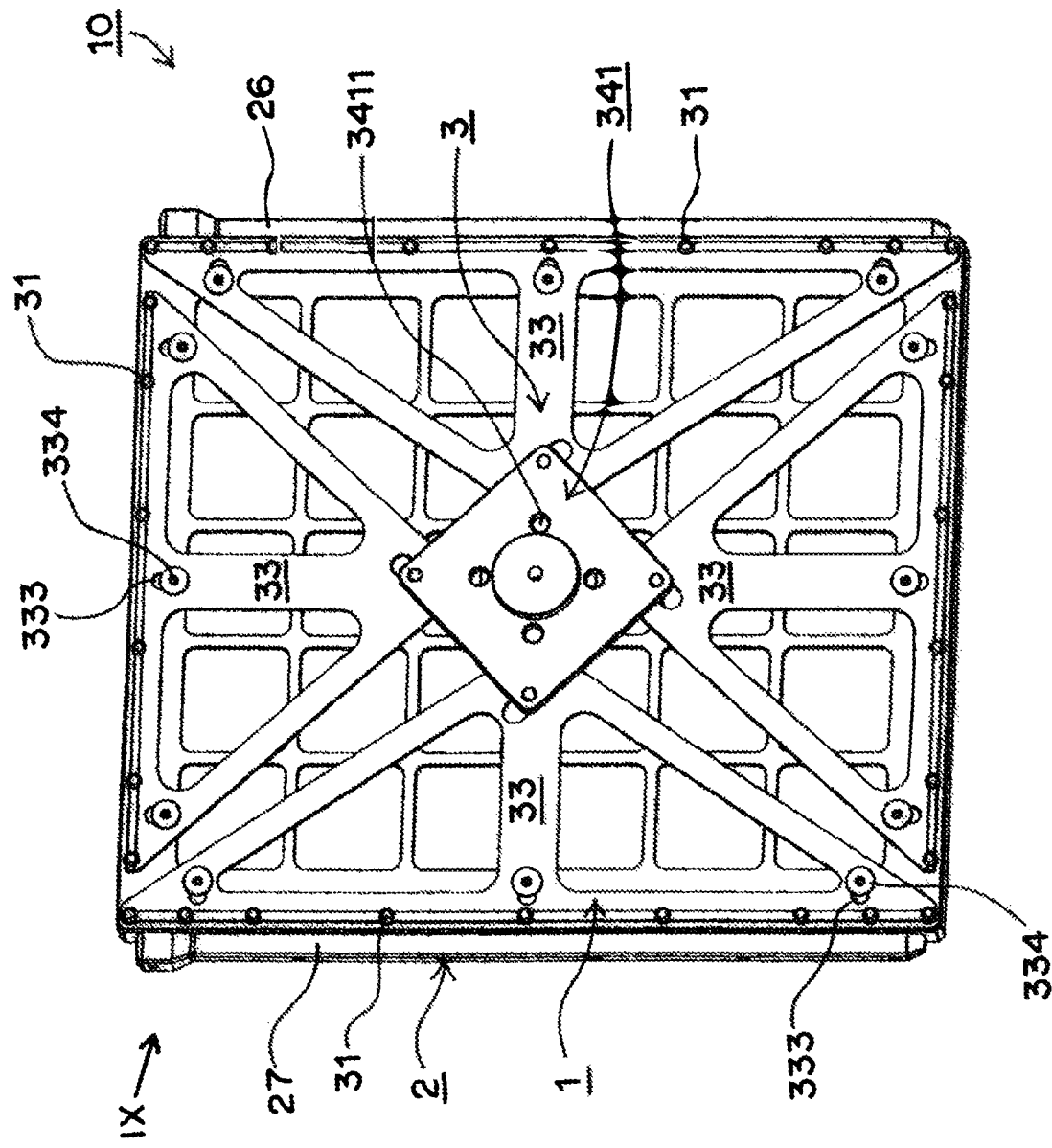
FIG. 8 is a view corresponding to FIG. 1, illustrating the lock mechanism in an on state.
Figure 9:
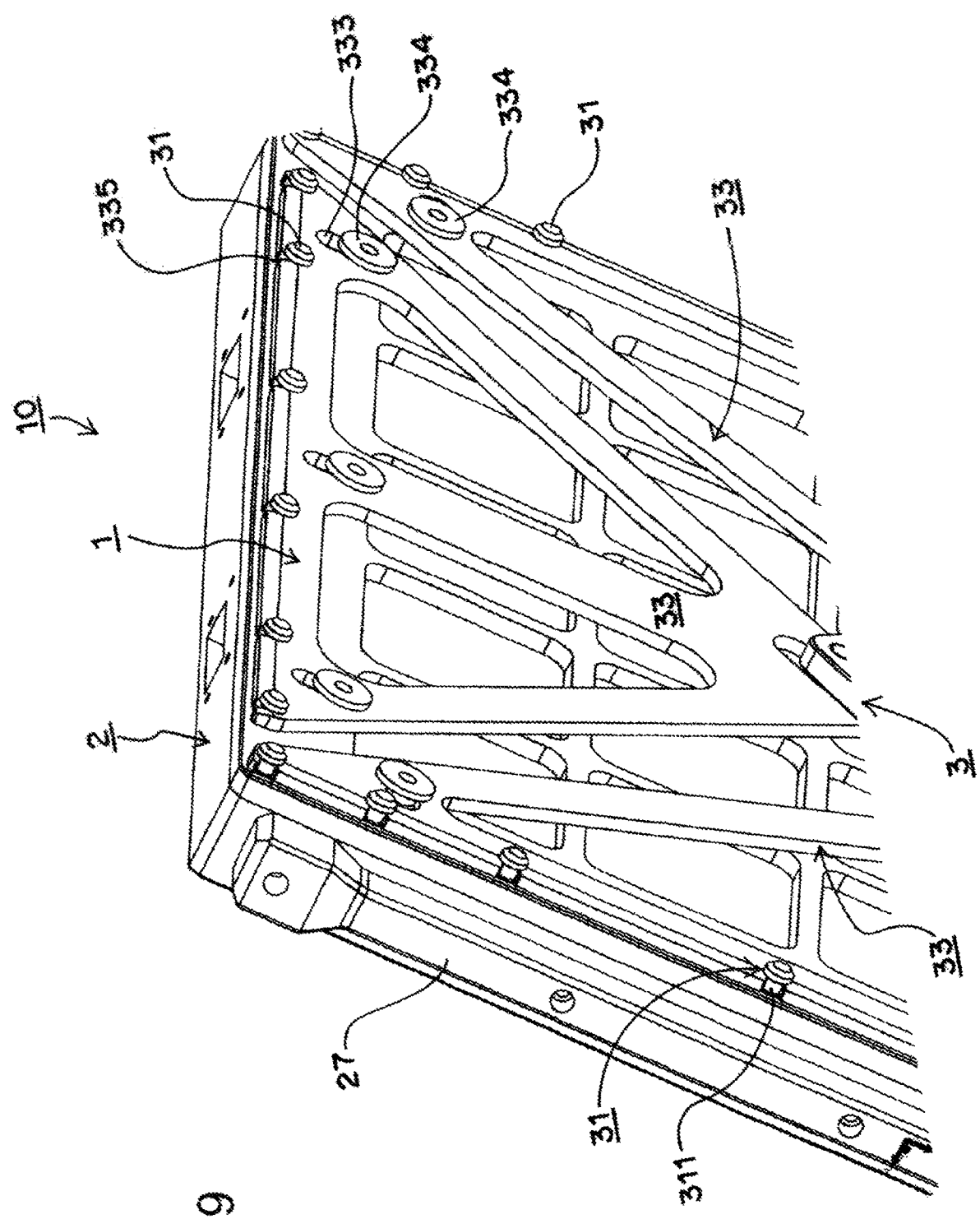
FIG. 9 is an enlarged partial view, viewed from arrow IX in FIG. 8.

When the fastening body 33 moves outward in the direction of arrow X and the notch 335 fits into the concave portion 311 of the first pin 31, the first pin 31 is fixed, and as a result, the frame body 2 is fixed to the back panel 1. That is, according to the lock mechanism 3, the notch 335 is fitted into the concave portion 311 at the tip of the first pin 31 by moving the fastening body 33 outward in the direction of arrow X with the moving mechanism 34, as illustrated in FIG. 8 and FIG. 9 that is an enlarged partial view, viewed from arrow IX in FIG. 8; and as a result, the frame body 2 can be locked to the back panel 1.

Figure 10:
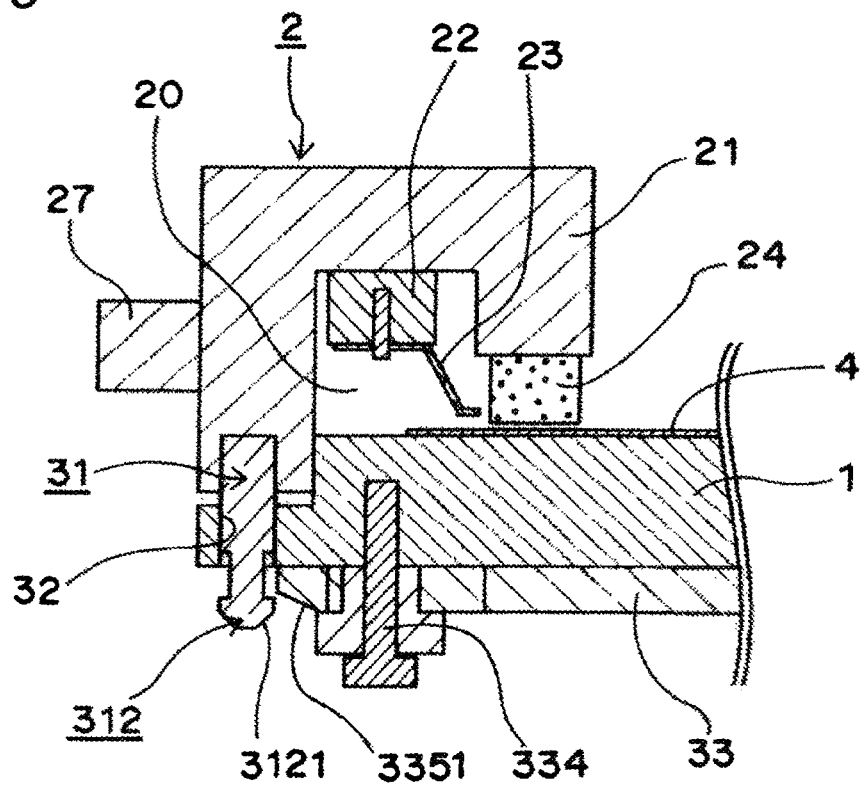
FIG. 10 is an enlarged cross-sectional partial view illustrating the operation of a fastening body, illustrating an off state of the lock mechanism.
Figure 11:
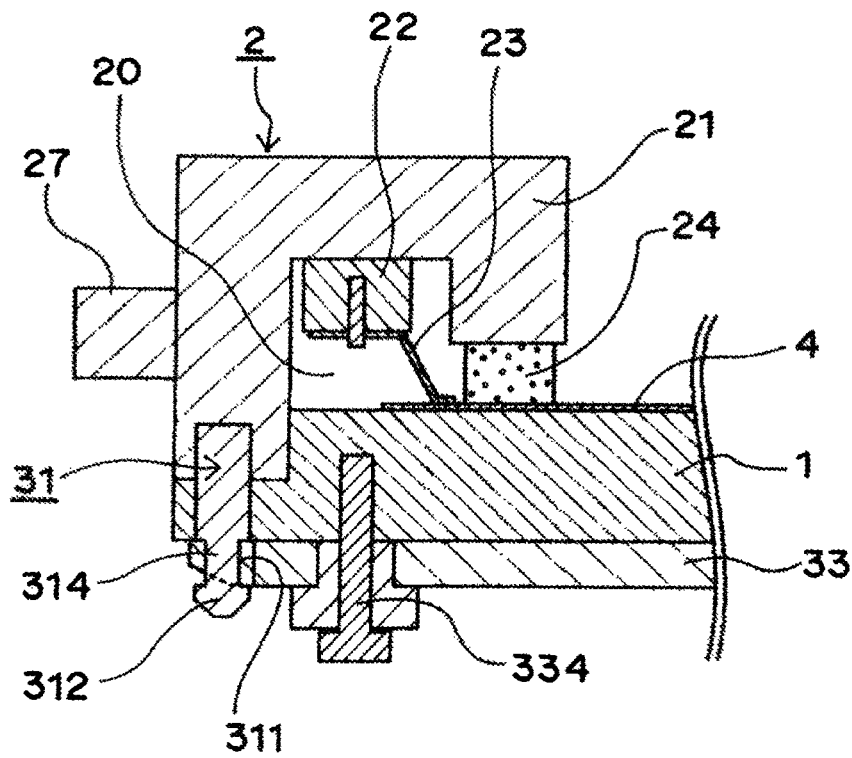
FIG. 11 is an enlarged cross-sectional partial view illustrating the operation of the fastening body, illustrating an on state of the lock mechanism.

FIGS. 10 and 11 are enlarged cross-sectional partial views each illustrating an operation of the fastening body 33. FIG. 10 illustrates an off state (unlocked state) of the lock mechanism 3, and FIG. 11 illustrates an on state (locked state) of the lock mechanism 3. The head portion 312 of the first pin 31 of the frame body 2 has a tapered shape having a tapered surface 3121. Therefore, the first pin 31 can be smoothly inserted into the first hole 32. The notch 335 of the fastening body 33 becomes thinner as going outward by forming a taper 3351. Therefore, even if the insertion of the first pin 31 into the first hole 32 is insufficient as illustrated in FIG. 10, the notch 335 can fit into the concave portion 311 while pulling out the first pin 31, as illustrated in FIG. 11.

Next, the operations of the workpiece holding jig 10 will be described.

(1) First, the workpiece 4 is placed on the back panel 1.

(2) Next, the frame body 2 is attached to the back panel 1. At this time, the first pin 31 of the frame body 2 is inserted through the first hole 32 of the back panel 1.

(3) Then, the lock mechanism 3 is operated. That is, the rotating body 341 is rotated in the direction of arrow R1. When the rotating body 341 rotates, the third pin 342 is forced to slide inward within the second long hole 343, whereby the fastening body 33 moves outward in the direction of arrow X, and as a result, the notch 335 of the fastening body 33 fits into the concave portion 311 of the first pin 31 of the frame body 2. Thereby, the frame body 2 is locked to the back panel 1.

(4) When the rotating body 341 is rotated in the direction of arrow R2 in the locked state, the third pin 342 is forced to slide outward within the second long hole 343, whereby the fastening body 33 moves inward in the direction of arrow X, and as a result, the fitting between the notch 335 of the fastening body 33 and the concave portion 311 of the first pin 31 of the frame body 2 is released, thereby allowing the lock between the frame body 2 and the back panel 1 to be released.

According to the workpiece holding jig 10 having the above configuration, the frame body 2 can be locked to the back panel 1 only by rotating the rotating body 341 of the lock mechanism 3. Therefore, the work of fixing the frame body 2 to the back panel 1 can be done in one operation. Therefore, work efficiency can be improved.

(Modification)

Figure 12:
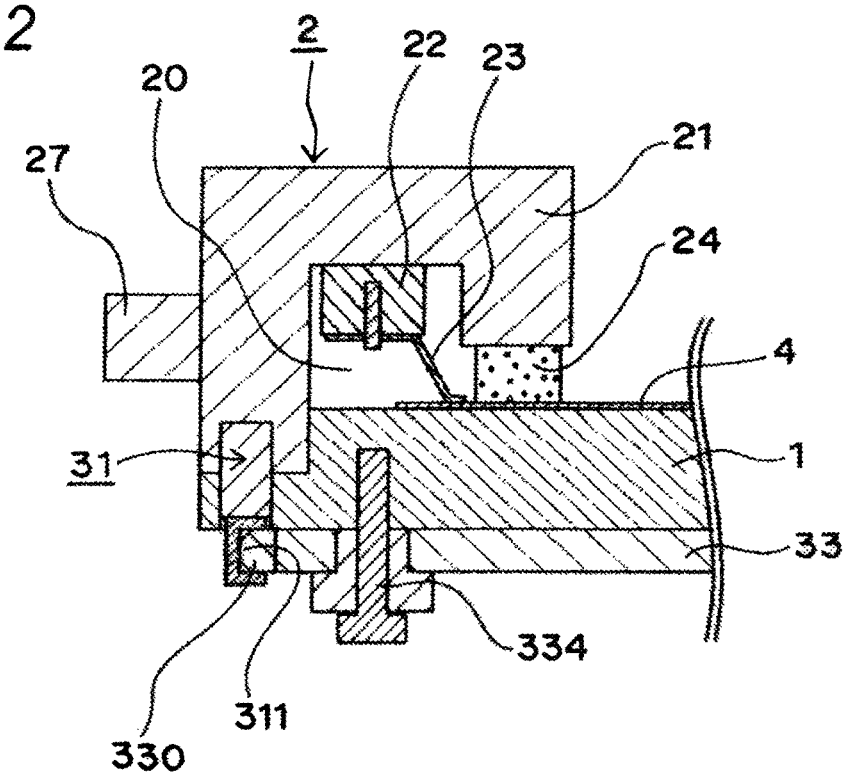
FIG. 12 is an enlarged cross-sectional partial view illustrating a modification of a fitting portion of the lock mechanism.

(1) The relationship between the concave portion 311 and the notch 335 may be changed as illustrated in FIG. 12. That is, in FIG. 12, the concave portion 311 of the first pin 31 is a lateral concave portion that is laterally opened, and the fitting portion is an outer periphery (bottom side portion) 330 of the fastening body 33 that can fit into the lateral concave portion. In this case, the notch is unnecessary.

Figure 13:
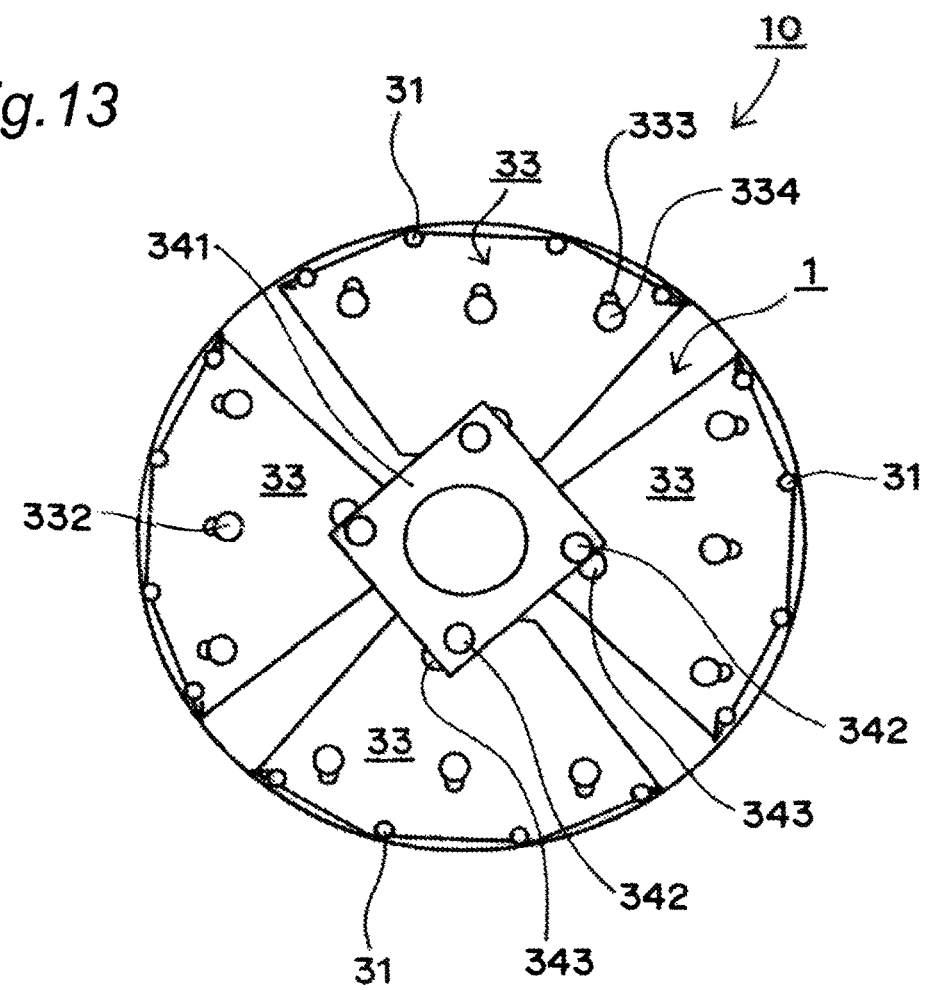
FIG. 13 is a rear view illustrating a modification of a form of the workpiece holding jig in plan view.

(2) The back panel 1 and the frame body 2 may have a circular shape in plan view, as illustrated in FIG. 13. In this case, the fastening body 33 has a substantially fan shape.

(3) The number of the fastening bodies 33 is not limited to four as long as being two or more.

(4) The number of the first long holes 333 is not limited to three, but in consideration of the stability of the operation of the fastening body 33, it is preferable that the number be two or more.

[Loading and Unloading Apparatus]

Figure 14:
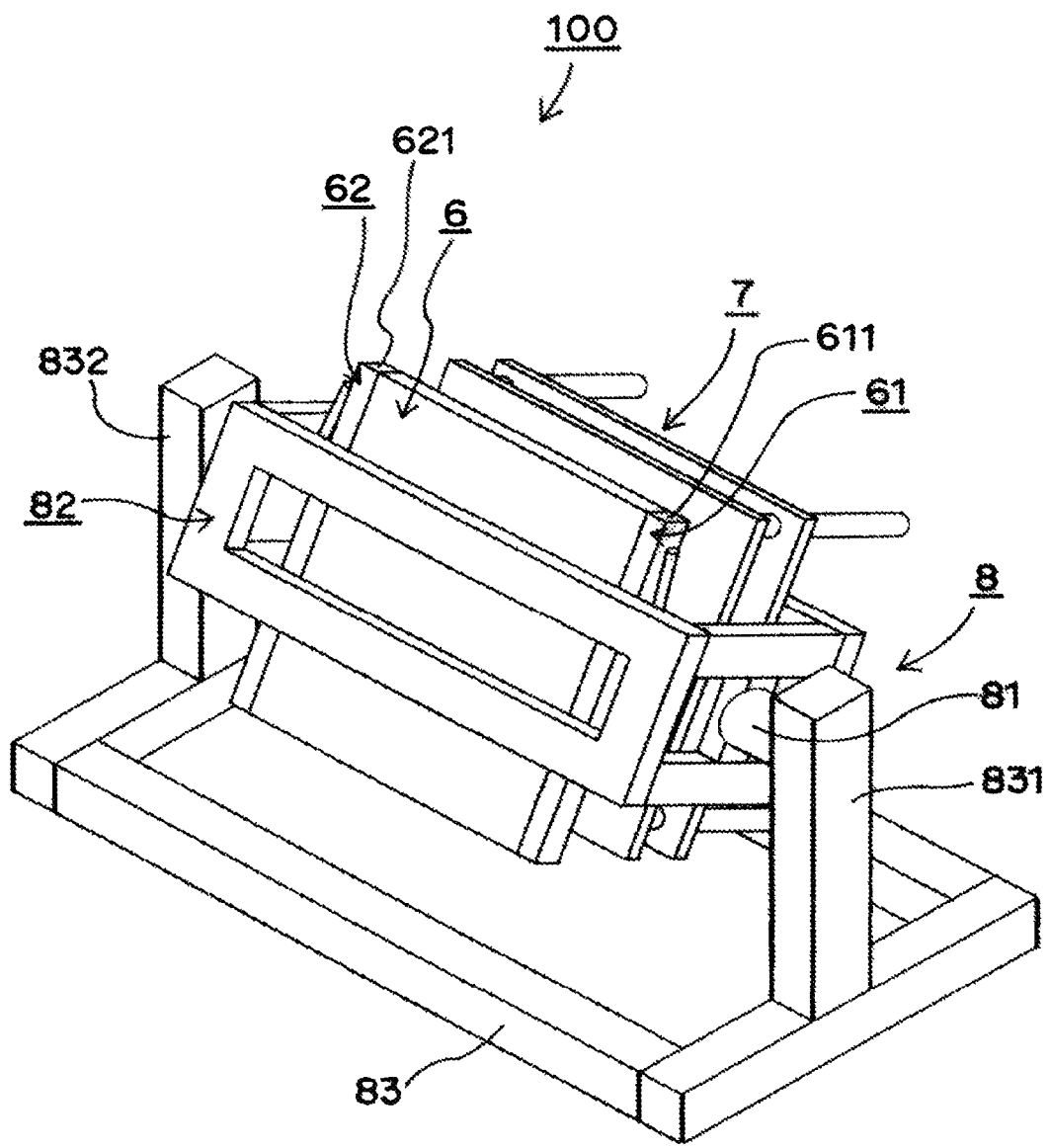
FIG. 14 is a perspective view illustrating a loading and unloading apparatus according to one embodiment of the present invention.

FIG. 14 is a perspective view illustrating a loading and unloading apparatus according to one embodiment of the present invention. This loading and unloading apparatus 100 is an apparatus that automatically loads and unloads the plate-shaped workpiece 4 into and from the workpiece holding jig 10 of the present invention.

The loading and unloading apparatus 100 includes: a housing unit 6 that houses the workpiece holding jig 10 that is locked; an attaching and detaching unit 7 that attaches and detaches the back panel 1 to and from the frame body 2 in the workpiece holding jig 10 housed in the housing unit 6; and a rotating unit 8 that rotationally displaces the housing unit 6 and the attaching and detaching unit 7 between a vertical state and a horizontal state.

(Housing Unit 6)

The housing unit 6 includes a right guide rail 61 and a left guide rail 62, and it is configured to house the workpiece holding jig 10 with the right guide bar 26 and the left guide bar 27 of the frame body 2 of the workpiece holding jig 10 inserted into the right guide rail 61 and the left guide rail 62, respectively. The right guide rail 61 and the left guide rail 62 have lower ends that are closed and upper ends that serve as insertion openings 611 and 621, respectively. The housing unit 6 has a stopper mechanism for fixing the housed workpiece holding jig 10.

Figure 15:
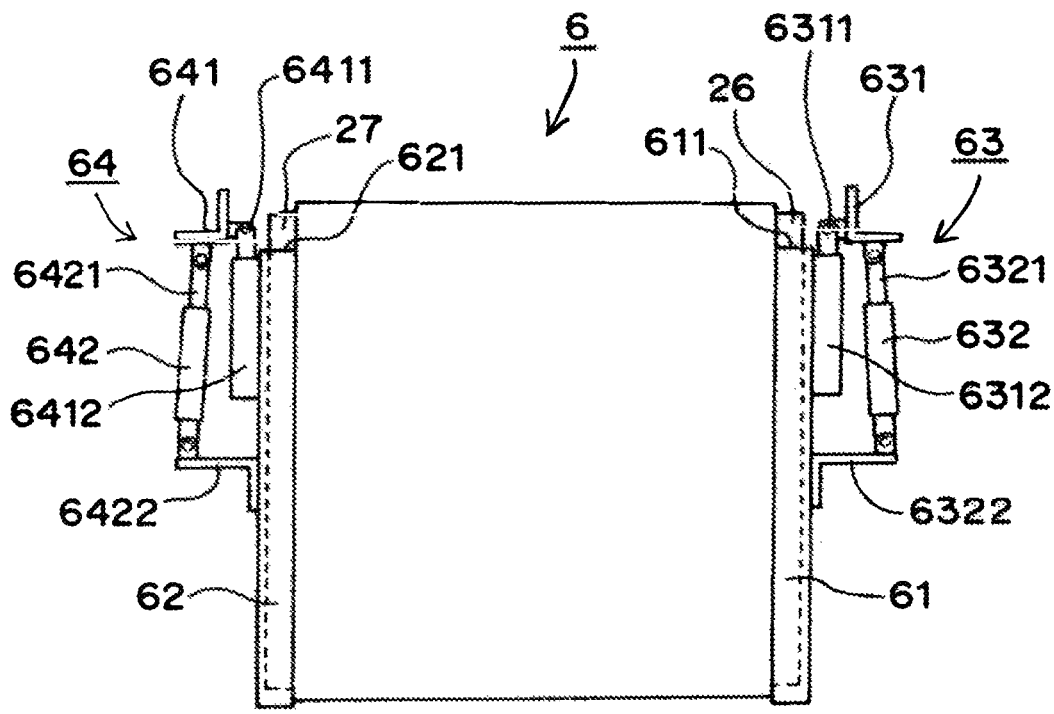
FIG. 15 is a front view of a housing unit in a vertical state, illustrating a stopper mechanism in a non-operating state.
Figure 16:
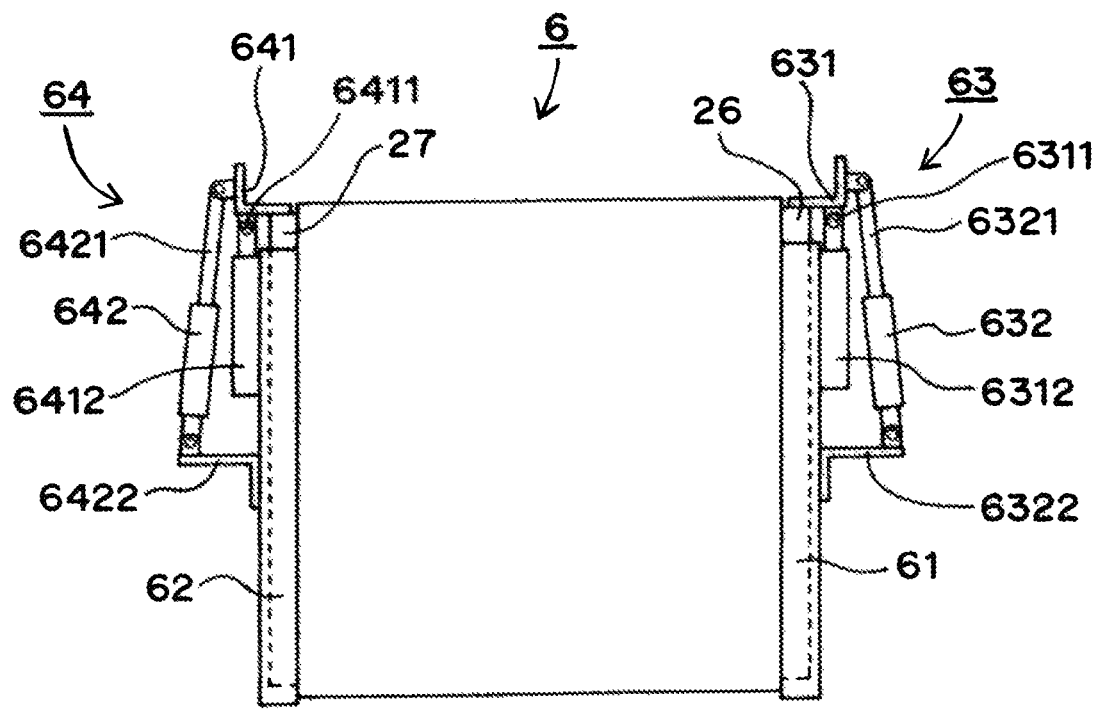
FIG. 16 is a front view of the housing unit in a vertical state, illustrating the stopper mechanism in an operating state.

The stopper mechanism has a right stopper 63 and a left stopper 64, as illustrated in FIG. 15. The right stopper 63 has: a pressing member 631 for pressing, near the insertion opening 611, the end surface of the right guide bar 26 inserted into the right guide rail 61; and a drive cylinder 632 for displacing the pressing member 631 between the pressing position and a non-pressing position. The pressing member 631 is supported by the right guide rail 61 via a rotating shaft 6311 and a bracket 6312 so as to be rotationally displaced. The drive cylinder 632 is configured to rotationally displace the pressing member 631 by extending and retracting a rod 6321 connected to the pressing member 631. The drive cylinder 632 is supported by the right guide rail 61 via a bracket 6322. The left stopper 64 is provided in the left guide rail 62, and has the same configuration as the right stopper 63 except for being symmetrical with the right stopper 63. That is, the left stopper 64 has a pressing member 641, a rotating shaft 6411, a bracket 6412, a drive cylinder 642, a rod 6421, and a bracket 6422. FIG. 15 illustrates a state before the stopper mechanism operates, while FIG. 16 illustrates a state after the stopper mechanism operates.

When the stopper mechanism operates, that is, when the drive cylinders 632, 642 operate and the rods 6321, 6421 extend, the pressing members 631, 641 are rotationally displaced, so that the end portions of the right guide bar 26 and the left guide bar 27 are pressed from above by the pressing members 631, 641, and as a result, the workpiece holding jig 10 is fixed in the housing unit 6. Conversely, when the drive cylinders 632, 642 operate and the rods 6321, 6421 retract, the pressing members 631, 641 are rotationally displaced, so that the end portions of the right guide bar 26 and the left guide bar 27 are released from the pressing members 631, 641, and as a result, the fixation of the workpiece holding jig 10 in the housing unit 6 is released.

(Attaching and Detaching Unit 7)

Figure 17:
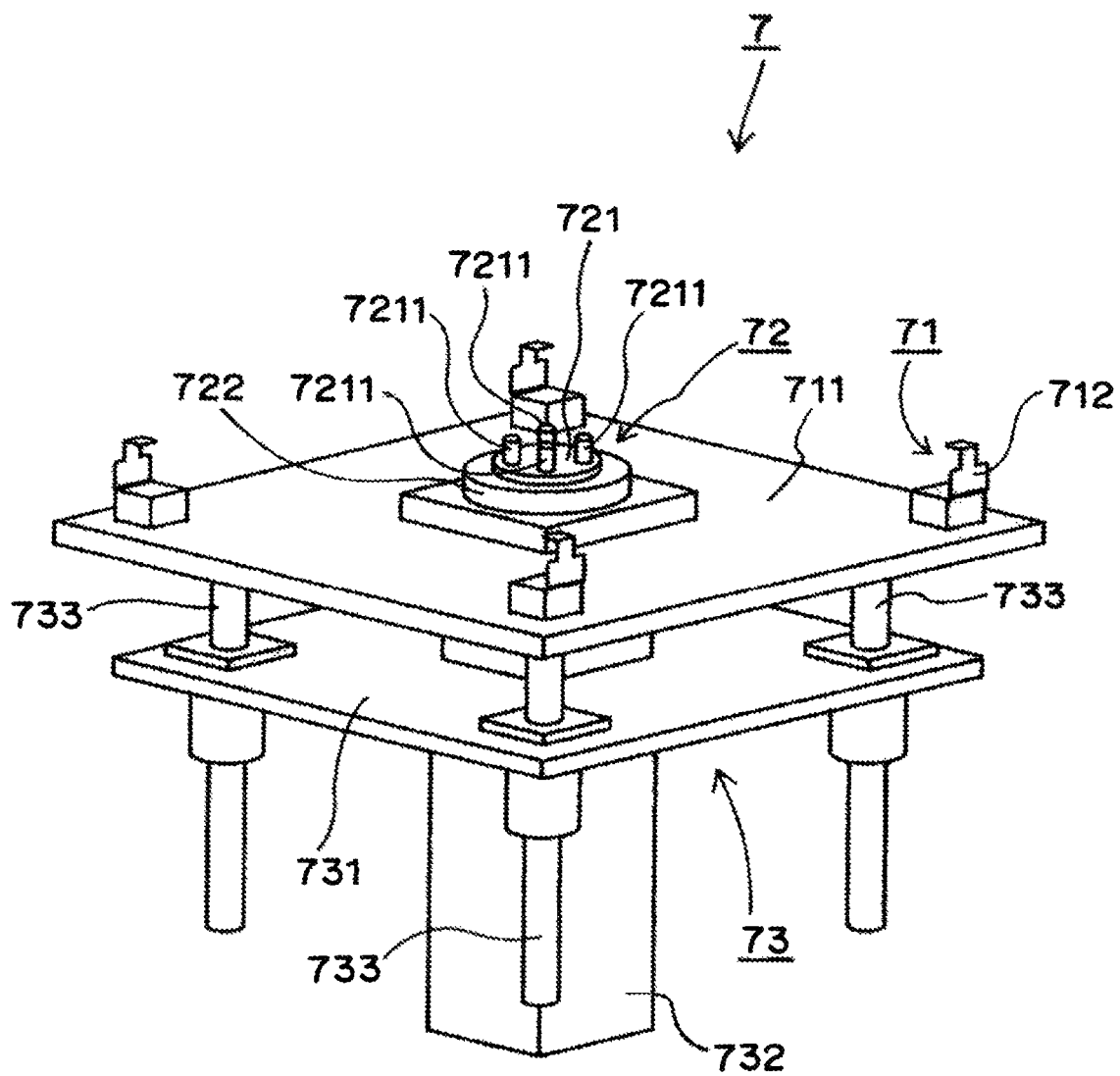
FIG. 17 is a perspective view of an attaching and detaching unit.

As illustrated in FIG. 17, the attaching and detaching unit 7 includes: a gripper 71 that grips the back panel 1 in the workpiece holding jig 10 in the horizontal state from the side of the rear surface; a switching unit 72 that turns on and off the lock mechanism 3 by operating the moving mechanism 34 of the workpiece holding jig 10; and an up-down moving unit 73 that moves up and down the gripper 71 gripping the back panel 1.

The gripper 71 has a movable plate 711 having a rectangular shape in plan view, and gripping claws 712 arranged at four corners of the movable plate 711. The gripper 71 is configured to grip the back panel 1 by inserting the gripping claw 712 into a long hole 15 (FIG. 18) of the back panel 1.

The switching unit 72 has: a rotating plate 721 having four insertion pins (fourth pins) 7211 to be inserted into four insertion holes 3411 (FIG. 1) of the rotating body 341 of the moving mechanism 34 of the workpiece holding jig 10; and a rotating unit 722 for rotating the rotating plate 721. The switching unit 72 is provided in the center of the movable plate 711. The switching unit 72 is configured to rotate the rotating body 341 of the moving mechanism 34 by rotating the rotating plate 721 in a state in which the insertion pin 7211 is inserted into the insertion hole 3411, thereby turning on and off the lock mechanism 3.

The up-down moving unit 73 has: a fixed plate 731 that supports a movable plate 711 so as to be movable up and down; a drive cylinder 732 that moves up and down the movable plate 711; and four linear shafts 733 that support the movable plate 711 so as to be movable to and from the fixed plate 731. The up-down moving unit 73 is configured to move up and down the movable plate 711 with respect to the fixed plate 731 by operating the drive cylinder 732.

(Rotating Unit 8)

The rotating unit 8 has a horizontal rotating shaft 81 and a rotating frame 82 fixed to the rotating shaft 81. The rotating frame 82 constitutes a box-shaped frame, and the housing unit 6 and the attaching and detaching unit 7 are fixed in the rotating frame 82. The rotating shaft 81 is supported by two vertical props 831, 832 on a horizontal base 83, and is configured to be rotationally driven by a drive unit (not illustrated).

Next, the operations of the loading and unloading apparatus 100 will be described.

(In Case of Loading Operations)

Figure 18:
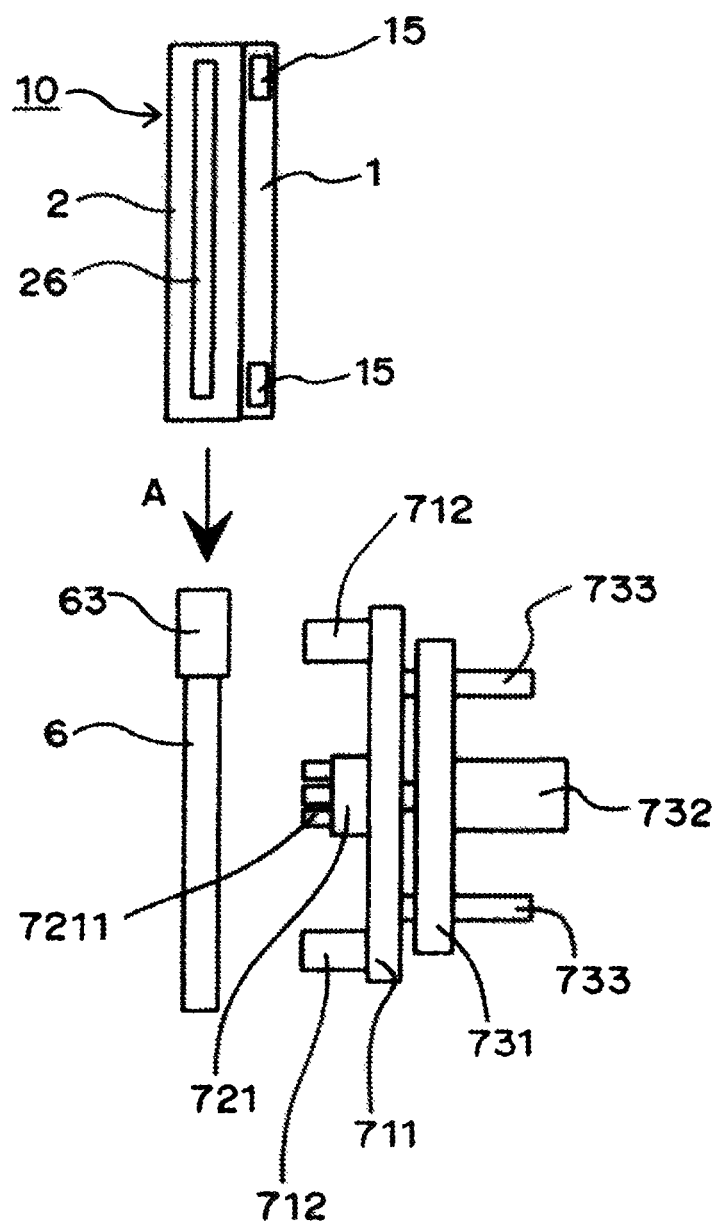
FIG. 18 is a schematic view illustrating one step of a loading operation of the loading and unloading apparatus.

(1) First, a jig transfer mechanism (not illustrated) for transferring the workpiece holding jig 10 operates, and the workpiece holding jig 10 that does not hold the workpiece 4 and is locked is transferred into the housing unit 6 set to the vertical state, as illustrated by arrow A in FIG. 18. That is, the right guide bar 26 and the left guide bar 27 of the frame body 2 in the workpiece holding jig 10 are inserted into the right guide rail 61 and the left guide rail 62, respectively, and as a result, the workpiece holding jig 10 is housed in the housing unit 6. When the workpiece holding jig 10 is housed, the stopper mechanism operates. That is, the drive cylinders 632, 642 operate, and the end surfaces of the right guide bar 26 and the left guide bar 27 are pressed by the pressing members 631, 641, respectively.

Figure 19:
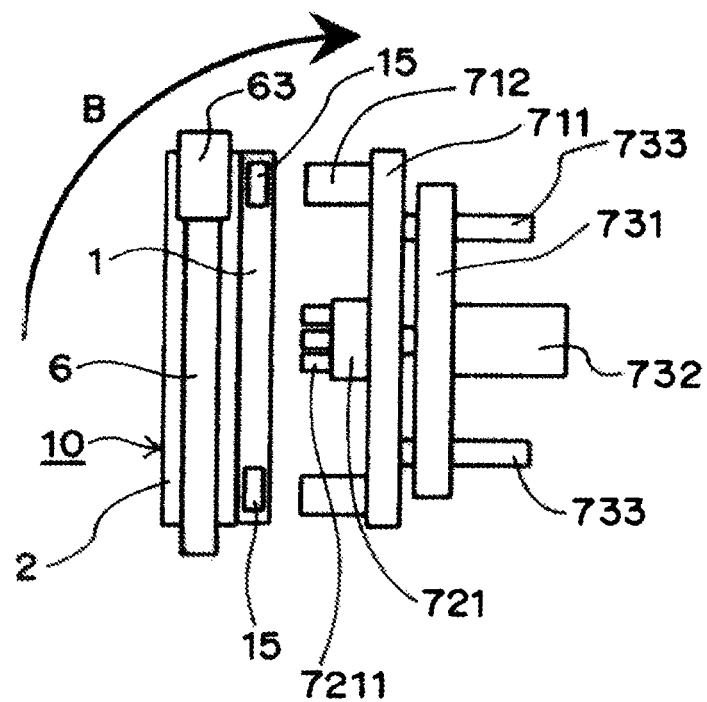
FIG. 19 is a schematic view of a step following FIG. 18.

(2) Next, the rotating unit 8 operates, and the housing unit 6 housing the workpiece holding jig 10 and the attaching and detaching unit 7 rotate from the vertical state to the horizontal state, as illustrated by arrow B in FIG. 19.

Figure 20:
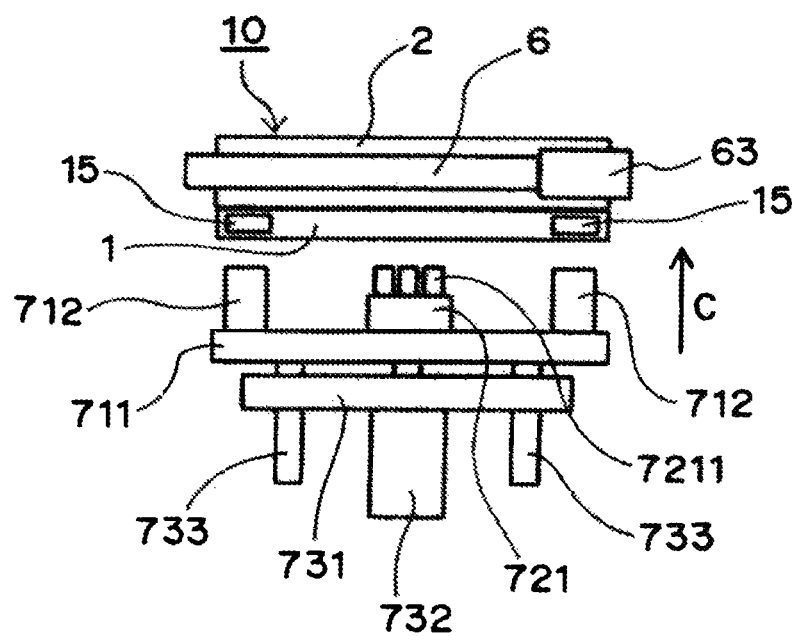
FIG. 20 is a schematic view of a step following FIG. 19.

(3) Next, the up-down moving unit 73 operates, and the movable plate 711 rises as illustrated by arrow C in FIG. 20.

Figure 21:
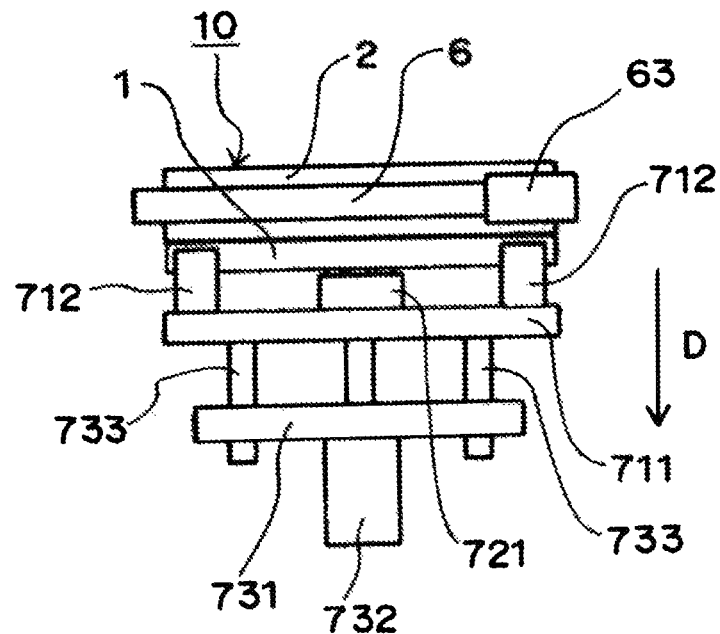
FIG. 21 is a schematic view of a step following FIG. 20.

(4) When the movable plate 711 rises, the back panel 1 is gripped by the gripping claws 712, as illustrated in FIG. 21. At this time, the four insertion pins 7211 of the switching unit 72 are inserted into the four insertion holes 3411 of the rotating body 341 of the moving mechanism 34 of the workpiece holding jig 10. Then, as the rotating plate 721 of the switching unit 72 rotates, the rotating body 341 of the moving mechanism 34 rotates. Thereby, the lock of the workpiece holding jig 10 by the lock mechanism 3 is released, and the back panel 1 can be separated from the frame body 2.

Figure 22:
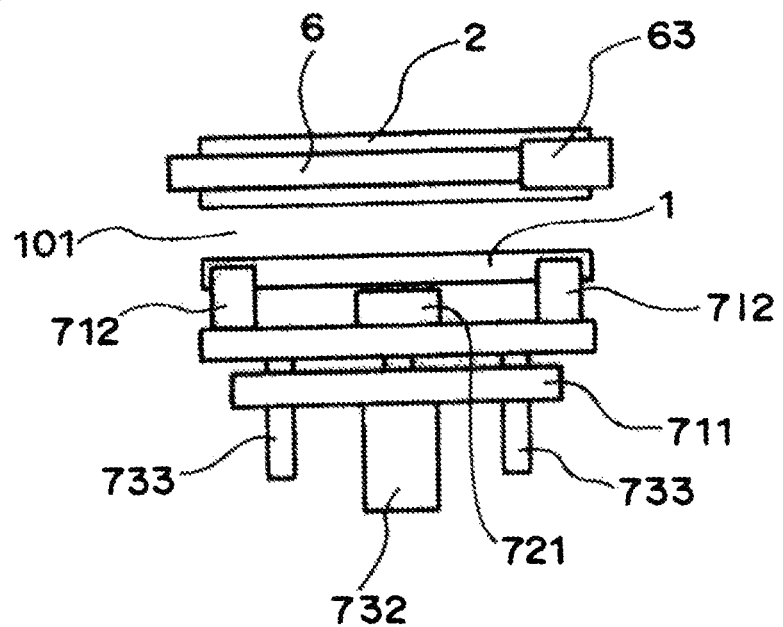
FIG. 22 is a schematic view of a step following FIG. 21.

(5) Next, the up-down moving unit 73 operates, and the movable plate 711 lowers as illustrated by arrow D in FIG. 21. Since the back panel 1 is gripped to the movable plate 711 by the gripping claws 712, the movable plate 711 lowers with the back panel 1. Thereby, the back panel 1 is separated from the frame body 2. FIG. 22 illustrates a state in which the back panel 1 is separated from the frame body 2.

Figure 23:
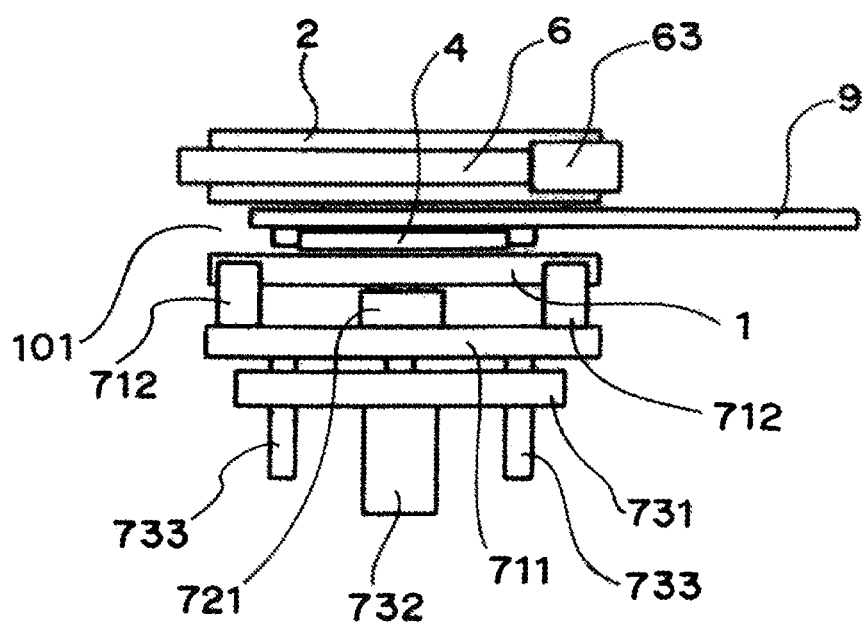
FIG. 23 is a schematic view of a step following FIG. 22.

(6) Next, the workpiece transfer mechanism 9 for transferring the workpiece 4 operates, and the workpiece 4 is transferred to the space 101 between the frame body 2 and the back panel 1 to be placed on the back panel 1, as illustrated in FIG. 23.

(7) Then, operations in the reverse order to the above series of operations are performed. That is, the back panel 1 on which the workpiece 4 is placed rises and is attached to the frame body 2; the workpiece holding jig 10 is locked and rotated to the vertical state; and the workpiece holding jig 10 is taken out from the housing unit 6 by the jig transfer mechanism, and is transferred to a predetermined surface treatment device.

(In Case of Unloading Operations)

(1) First, the jig transfer mechanism operates, and the workpiece holding jig 10 that holds the workpiece 4 and is locked is housed in the housing unit 6 set to the vertical state, as illustrated in FIG. 18.

(2) The subsequent operations are the same as the case of the loading operation, that is, the operations illustrated in FIGS. 19 to 22 are performed.

(3) Then, the workpiece transfer mechanism 9 operates, and the workpiece 4 on the back panel 1 is taken out from the space 101 between the frame body 2 and the back panel 1, as illustrated in FIG. 23. Thereby, the unloading operations end.

(4) Thereafter, the workpiece transfer mechanism 9 operates; a new workpiece 4 is transferred to the space 101 between the frame body 2 and the back panel 1 and is placed on the back panel 1; and, the apparatus 100 operates in the same way as the above-mentioned (7) in the case of the loading operations. That is, the loading operations are performed.

According to the loading and unloading apparatus 100 having the above configuration, with respect to the work holding jig 10, it can be automatically done that the lock mechanism 3 is turned off, the back panel 1 is separated from the frame body 2, and the workpiece 4 is placed on or taken out from the back panel 1. Therefore, the work of loading and unloading the workpiece 4 can be done efficiently.

(Modification)

(1) The number of the insertion pins 7211 is not limited to four, but may be one as long as the insertion pin 7211 has a form capable of engaging with the rotating body 341 in the direction of rotation.

INDUSTRIAL APPLICABILITY

The workpiece holding jig of the present invention can perform the work of fixing a frame body to a back panel in one operation, and hence its industrial use value is large.

DESCRIPTION OF REFERENCE NUMERALS

1: Back panel
2: Frame body
3: Lock mechanism
31: First pin
311: Concave portion
314: Small-diameter portion
32: First hole
33: Fastening body
330: Outer periphery
333: First long hole
334: Second pin
335: Notch
34: Moving mechanism
341: Rotating body
3411: Insertion hole
342: Third pin
343: Second long hole
4: Plate-shaped workpiece
41: Peripheral portion
6: Housing unit
7: Attaching and detaching unit
71: Gripper
72: Switching unit
721: Insertion pin (fourth pin)
73: Up-down moving unit
8: Rotating unit
10: Workpiece holding jig
100: Loading and unloading apparatus
101: Space

The invention claimed is:

1. A workpiece holding jig for holding a plate-shaped workpiece that is an object to be surface-treated, the workpiece holding jig comprising:
a back panel that supports the workpiece from a side of a rear surface of the workpiece;
a frame body that is attached to the back panel from a side of a front surface of the workpiece so as to hold a peripheral portion of the workpiece between the frame body and the back panel; and
a lock mechanism for locking the frame body, attached to the back panel, to the back panel,
wherein
the lock mechanism includes:
a number of first pins that are arranged along a periphery of the frame body and protrude from the frame body;
a number of first holes that are formed in the back panel and through which the first pins can be inserted;
two or more fastening bodies that are provided on a rear surface of the back panel and are movable in an inward and outward direction from a center along the rear surface of the back panel; and
a moving mechanism that simultaneously moves all the fastening bodies in the inward and outward direction by rotating a rotating body that rotates at the center of the rear surface of the back panel, wherein:
each of the two or more fastening bodies has a frame structure or a plate structure, and has, at its outer periphery, a fitting portion that can be fitted into a concave portion at a tip of a respective first pin of the number of first pins exposed from a respective first hole; and the lock mechanism is configured to lock the frame body to the back panel by moving the two or more fastening bodies outward with the moving mechanism and by fitting the fitting portion of each of the two or more fastening bodies into the concave portion at the tip of the respective first pin of the number of first pins.

2. The workpiece holding jig according to claim 1, wherein
each of the two or more fastening bodies has a first long hole through which a respective second pin protruding from the rear surface of the back panel is inserted, and is movable in the inward and outward direction by sliding along the respective second pin.

3. The workpiece holding jig according to claim 1, wherein:
the rotating body has a third pin fitted in a respective second long hole formed in each of the two or more fastening bodies; and
the moving mechanism is configured to move the two or more fastening bodies in the inward and outward direction by rotating the rotating body and by sliding the third pin within the respective second long holes.

4. The workpiece holding jig according to 1, wherein:
the concave portion of each of the respective first pins of the number of first pins is configured by a small-diameter portion; and
the fitting portion of each of the two or more fastening bodies is a notch that externally fits to the small-diameter portion.

5. The workpiece holding jig according to claim 1, wherein:
the concave portion of each of the respective first pins of the number of first pins is a lateral concave portion that is opened laterally; and
the fitting portion of each of the two or more fastening bodies is the outer periphery of the two or more fastening bodies that can be fitted into the lateral concave portion.

6. The workpiece holding jig according to claim 1, wherein
the two or more fastening bodies includes four of the fastening bodies provided at substantially equal intervals in a circumferential direction on the rear surface of the back panel.

7. The workpiece holding jig according to claim 2, wherein
each of the two or more fastening bodies has three or more of the first long holes at substantially equal intervals and in parallel in the circumferential direction.

8. The workpiece holding jig according to claim 2, wherein:
the rotating body has a two or more third pins, each of the two or more third pins being fitted in a respective second long hole formed in each of the two or more fastening bodies; and
the moving mechanism is configured to move the two or more fastening bodies in the inward and outward direction by rotating the rotating body and by sliding the two or more third pins within the respective second long holes.

9. The workpiece holding jig according to claim 2, wherein:
the concave portion of each of the respective first pins of the number of first pins is configured by a small-diameter portion; and
the fitting portion of each of the two or more fastening bodies is a notch that externally fits to the small-diameter portion of the respective first pins of the number of first pins.

10. The workpiece holding jig according to claim 3, wherein:
the concave portion of each of the respective first pins of the number of first pins is configured by a small-diameter portion; and
the fitting portion of each of the two or more fastening bodies is a notch that externally fits to the small-diameter portion of the respective first pins of the number of first pins.

11. The workpiece holding jig according to claim 8, wherein:
the concave portion of each of the respective first pins of the number of first pins is configured by a small-diameter portion; and
the fitting portion of each of the two or more fastening bodies is a notch that externally fits to the small-diameter portion of the respective first pins of the number of first pins.

12. The workpiece holding jig according to claim 2, wherein:
the concave portion of each of the respective first pins of the number of first pins is a lateral concave portion that is opened laterally; and
the fitting portion of each of the two or more fastening bodies is the outer periphery of the respective fastening bodies that can be fitted into the lateral concave portion of the respective first pins of the number of first pins.

13. The workpiece holding jig according to claim 3, wherein:
the concave portion of each of the respective first pins of the number of first pins is a lateral concave portion that is opened laterally; and
the fitting portion of each of the two or more fastening bodies is the outer periphery of the respective fastening bodies that can be fitted into the lateral concave portion of the respective first pins of the number of first pins.

14. The workpiece holding jig according to claim 2, wherein
the two or more fastening bodies includes four of the fastening bodies provided at substantially equal intervals in a circumferential direction on the rear surface of the back panel.

15. The workpiece holding jig according to claim 3, wherein
the two or more fastening bodies includes four of the fastening bodies provided at substantially equal intervals in a circumferential direction on the rear surface of the back panel.

16. The workpiece holding jig according to claim 8, wherein
the two or more fastening bodies includes four of the fastening bodies provided at substantially equal intervals in a circumferential direction on the rear surface of the back panel.

17. The workpiece holding jig according to claim 11, wherein
the two or more fastening bodies includes four of the fastening bodies provided at substantially equal intervals in a circumferential direction on the rear surface of the back panel.

* * * * *